United States Patent
Qin et al.

(10) Patent No.: US 10,109,610 B2
(45) Date of Patent: Oct. 23, 2018

(54) WIRE BONDING SYSTEMS AND RELATED METHODS

(71) Applicant: SEMICONDUCTOR COMPONENTS INDUSTRIES, LLC, Phoenix, AZ (US)

(72) Inventors: Wentao Qin, Gilbert, AZ (US); Gordon M. Grivna, Mesa, AZ (US); Harold Anderson, Chandler, AZ (US); Thomas Anderson, Chandler, AZ (US); George Chang, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/091,436

(22) Filed: Apr. 5, 2016

(65) Prior Publication Data

US 2016/0307865 A1   Oct. 20, 2016

Related U.S. Application Data

(60) Provisional application No. 62/149,455, filed on Apr. 17, 2015, provisional application No. 62/256,130, filed on Nov. 17, 2015.

(51) Int. Cl.
*H01L 23/00* (2006.01)

(52) U.S. Cl.
CPC .............. *H01L 24/45* (2013.01); *H01L 24/05* (2013.01); *H01L 2224/02166* (2013.01); *H01L 2224/04042* (2013.01); *H01L 2224/05573* (2013.01); *H01L 2224/05624* (2013.01); *H01L 2224/45144* (2013.01); *H01L 2224/45147* (2013.01); *H01L 2224/45565* (2013.01); *H01L 2224/45647* (2013.01); *H01L 2224/48463* (2013.01); *H01L 2224/48507* (2013.01)

(58) Field of Classification Search
CPC ..................... H01L 24/45; H01L 24/05; H01L 2224/04042; H01L 2224/05573; H01L 2224/05624; H01L 2224/45647
See application file for complete search history.

(56) References Cited

U.S. PATENT DOCUMENTS

| 7,078,796 B2 | 7/2006 | Dunn et al. |
| 2003/0107137 A1* | 6/2003 | Stierman ............... B81B 7/0006 257/763 |

(Continued)

FOREIGN PATENT DOCUMENTS

EP   0529298 A2   3/1993

OTHER PUBLICATIONS

Steven G. Bratsch, "Standard Electrode Potential and Temperature Coefficient in Water at 298.15K", J. Phys. Chem. Ref. Data, vol. 18, No. 1 ( Jan. 1989 ), pp. 1-21.*

(Continued)

*Primary Examiner* — Bilkis Jahan
*Assistant Examiner* — Victor Barzykin
(74) *Attorney, Agent, or Firm* — IPTechLaw

(57) ABSTRACT

A wire bond system. Implementations may include: a bond wire including copper (Cu), a bond pad including aluminum (Al) and a sacrificial anode electrically coupled with the bond pad, where the sacrificial anode includes one or more elements having a standard electrode potential below a standard electrode potential of Al.

10 Claims, 3 Drawing Sheets

(56) References Cited

U.S. PATENT DOCUMENTS

| | | | |
|---|---|---|---|
| 2005/0001316 A1* | 1/2005 | Dean | H01L 24/05 257/750 |
| 2009/0032947 A1* | 2/2009 | Na | H01L 23/49838 257/738 |
| 2010/0244249 A1* | 9/2010 | Coffy | H01L 24/05 257/741 |
| 2013/0140068 A1 | 6/2013 | Sarangapani et al. | |
| 2013/0140084 A1 | 6/2013 | Sarangapani et al. | |
| 2013/0142567 A1 | 6/2013 | Sarangapani et al. | |
| 2013/0142568 A1 | 6/2013 | Sarangapani et al. | |
| 2013/0176070 A1* | 7/2013 | Guard | G06F 3/044 327/517 |
| 2014/0346663 A1* | 11/2014 | Chopin | H01L 24/05 257/737 |
| 2015/0311173 A1 | 10/2015 | Carpenter et al. | |

OTHER PUBLICATIONS

"Wire Wisdom," Anixter, Inc., Jun. 6, 2012, 2 pages.

Kawashiro et al., "Reliability of copper wire bonds on a novel over-pad metallization," Jap. J. of App. Phys., V. 54, 05EC01, (published online Apr. 7, 2015).

Clauberg et al., "Nickel-palladium bond pads for copper wire bonding," Microelectronics Reliability, V. 51, V. 1, p. 75-80 (Jan. 2011).

* cited by examiner

WIRE BONDING SYSTEMS AND RELATED METHODS

CROSS REFERENCE TO RELATED APPLICATIONS

This document claims the benefit of the filing date of U.S. Provisional Patent Application Ser. No. 62/149,455 (the '455 Provisional), entitled "Bond Wires and Methods" to Qin et al. which was filed on Apr. 17, 2015 and also claims the benefit of the filing date of U.S. Provisional Patent Application Ser. No. 62/256,130 (the '130 Provisional) entitled "Wire Bond Structures and Methods" to Qin et al. which was filed on Nov. 17, 2015, the disclosures of each of which are hereby incorporated entirely herein by reference.

BACKGROUND

1. Technical Field

Aspects of this document relate generally to structures and systems used for wire bonding.

2. Background

Wire bonding involves thermally, mechanically and electrically connecting a wire with a bonding pad. In various ball wire bonding systems, ultrasonic or other energy is used to melt the wire to form a free ball that is then pressed down on the bond pad. The process results in the mixing of the materials of the wire and the bond pad, forming a wire bond.

SUMMARY

Implementations of wire bond systems may include: a bond wire including copper (Cu), a bond pad including aluminum (Al) and a sacrificial anode electrically coupled with the bond pad, where the sacrificial anode includes one or more elements having a standard electrode potential below a standard electrode potential of Al.

Implementations of wire bond systems may include one, all, or any of the following:

The one or more elements may be one of magnesium (Mg), hafnium (Hf), beryllium (Be) or any combination thereof.

Implementation of wire bond systems may include a bond wire including Cu, a bond pad including Al, and a sacrificial anode physically and electrically coupled over at least a portion of bond pad where the sacrificial anode includes one or more elements having a standard electrode potential below a standard electrode potential of Al.

Implementations of wire bond systems may include one, all, or any of the following:

The one or more elements may be one of Mg, Hf, Be, or any combination thereof.

Implementations of a wire bond system may include a bond wire including Cu and a bond pad coupled to the bond wire where the bond pad includes a material including Al and one or more elements having a standard electrode potential between a standard electrode potential of Cu and a standard electrode potential of Al.

Implementations of wire bond systems may include one, all, or any of the following:

The one or more elements may include tungsten (W).
The one or more elements may include zinc (Zn).
The one or more elements may include chromium (Cr).
The one or more elements may include tin (Sn).
The one or more elements may include iron (Fe).
The one or more elements may be selected from the group consisting of molybdenum (Mo), cadmium (Cd), cobalt (Co), nickel (Ni), Cu, or any combination thereof.

The bond wire may include a coating including a metal selected from the group consisting of gold (Au), silver (Ag), palladium (Pd), nickel (Ni), or any combination thereof.

The bond wire may further include Ni.

Implementations of a wire bond system may include a bond wire including Cu, a bond pad coupled to the bond wire, the bond pad including Al, and a layer coupled to the bond pad between the bond wire and the bond pad, where the layer includes one or more elements having a standard electrode potential between a standard electrode potential of Al and a standard electrode potential of Cu.

Implementations of wire bond system may include one, all, or any of the following:

The one or more elements may include W.
The one or more elements may include Zn.
The one or more elements may include Cr.
The one or more elements may include Sn.
The one or more elements may be selected from the group consisting of Mo, Cd, Co, Ni, Fe, Cu, or any combination thereof.

The bond pad may further include one or more elements having a standard electrode potential between a standard electrode potential of Cu and a standard electrode potential of Al.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended wire, pad, and wire bonding systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such wires, pads, and wire bonding systems, and implementing components and methods, consistent with the intended operation and methods.

Figure 1:
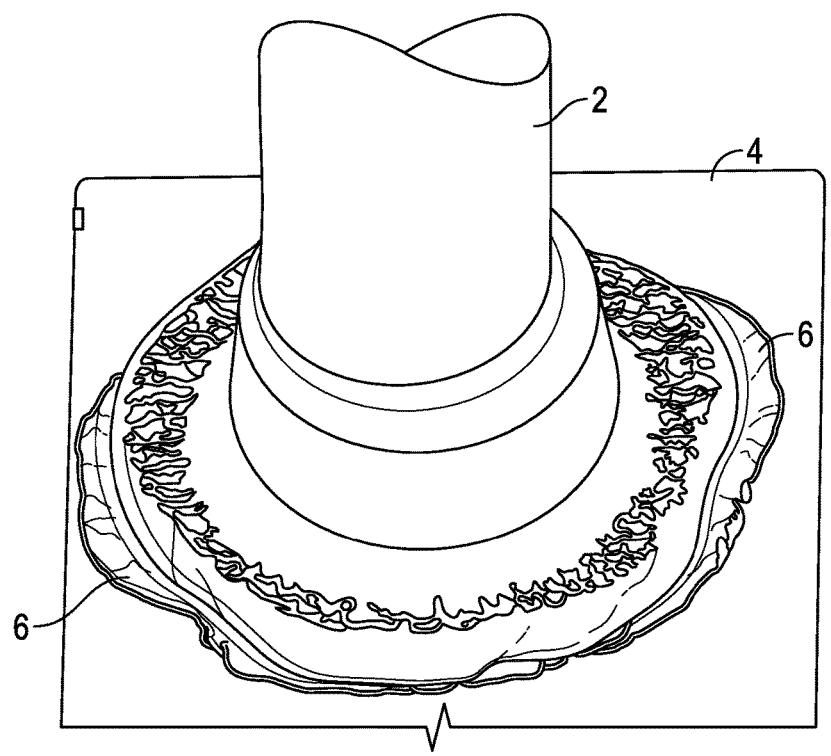
FIG. 1 is a perspective view of a wire bonded to a pad.
Figure 2:
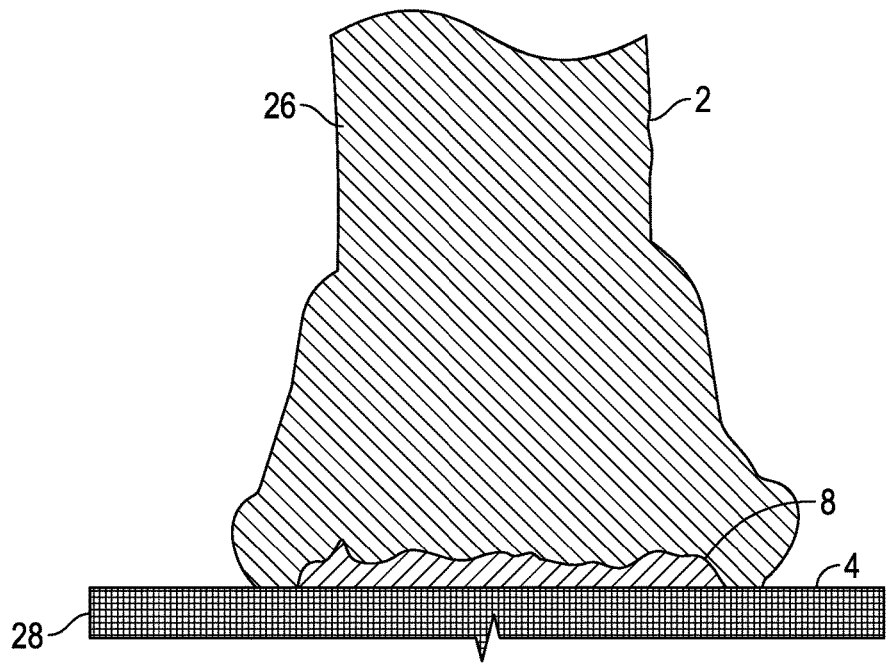
FIG. 2 is a cross sectional view of a wire bonded to a pad implementation.

Referring to FIG. 1, a perspective view of a bond wire (wire) 2 bonded to a bond pad (pad) 4 is illustrated. In this implementations, the wire 2 has been bonded to the pad 4 using a ball bonding process. As illustrated, during the bonding process, the wire 2 is melted and the resulting ball is then connected to the pad. A combination of ultrasonic energy with heat as a byproduct, or ultrasonic energy with external heat source softens the ball and causes the softened material to flow under load when pressed down on the pad 4, causing the two materials to mix/stick to one another. As can be seen, during this process, depending on the hardness of the ball on the wire, a certain amount of pad metal displacement (PMD) or aluminum splash 6 can be observed around the edges of the wire. Because of the temperatures/energies involved during various wire bonding processes, whether ball bonding or wedge bonding, various mixtures of the materials of the wire and the pad are observed after the bonding process is completed. Where the wire 2 and the pad 4 are made of metallic materials, the mixtures are alloys which include various intermetallic compounds (IMCs) of the metals of the wire 2 and the pad 4. FIG. 2 illustrates a cross section of a wire bond like that illustrated in FIG. 1, showing the wire 2, the pad 4, and an alloy stack 8. While in FIG. 2, the alloy stack 8 is illustrated as extending upwardly toward the wire 2, in various implementations, the alloy stack 8 may also extend downwardly into the pad 4. In various implementations, there may be no detectable alloy stack 8 immediately following bonding, but the alloy stack 8 becomes easily detected after operation of the semiconductor package and/or testing.

Where the wire 2 contains copper (Cu) and the pad contains aluminum (Al), the potential for corrosion to take place exists following the bonding process. This is because the standard $Cu/Cu^{2+}$ electrode has a standard electrode potential of +0.342 eV and the standard $Cu/Cu^{1+}$ electrode has a standard electrode potential of +0.521 eV while the standard $Al/Al^{3+}$ electrode has a standard electrode potential of −1.66 eV. In the various system implementations disclosed in this document, either of the Cu standard electrode potentials can be used as a reference. Because the potentials are different, in the presence of a humid environment, it is possible for galvanic corrosion to take place. Without being bound by any theory, it is also believed that any halogens contained in mold compounds surrounding the wire bond can further accelerate the corrosion process. Because of the corrosion, the IMCs become oxidized and cracks can spread between the wire and the pad, resulting in electrical separation of the two. Because extensive amounts of time may be required before the corrosion creates this result, the corrosion process creates a reliability concern that cannot be detected in the initial test process of a semiconductor package.

The '455 Provisional previously incorporated by reference, and the article by Qin et al., entitled "Corrosion Mechanisms of Cu Bond Wires on AlSi Pads," *Conference Proceedings from the 41st International Symposium for Testing and Failure Analysis*, p. 423-428 (November 2015), (Qin et al.) the disclosure of which is hereby incorporated entirely herein by reference, each discloses in detail proposed mechanisms for the corrosion process between Cu and Al following wire bonding observed following Highly Accelerated Stress Testing (HAST) testing. Without being bound by any particular theory, it appears that where the wires contain Cu and the pad contains an alloy of AlSi, various Cu-rich IMCs formed which then, during the testing, subsequently corrode.

In this document, various wire, pad, and wire bonding system implementations that are designed to minimize/mitigate the potential for corrosion occurring between a Cu-containing wire and an Al-containing pad are disclosed. A wide variety of Cu-containing bond wires may be used in various implementations. Some of these may include, by non-limiting example, 1N, 2N, 3N, 4N, 5N, and 6N copper wire; coated copper wire; and alloyed copper wire. By non-limiting example, any of the alloyed copper wire versions disclosed in the following references may be used in various implementations: U.S. Patent Application Publication No. 20130142567 to Sarangapani et al., entitled "Doped 4N copper wires for bonding in microelectronics devices," filed Nov. 29, 2012; U.S. Patent Application Publication No. 20130142568 to Sarangapani et al., entitled "3N copper wires with trace additions for bonding in microelectronics devices," filed Nov. 30, 2012; U.S. Patent Application Publication No. 20130140068 to Sarangapani et al., entitled "Secondary alloyed 1N copper wires for bonding in microelectronics devices," filed Nov. 29, 2012; and U.S. Patent Application Publication No. 20130140084 to Sarangapani et al., entitled "Alloyed 2N copper wires for bonding in microelectronics devices," filed Nov. 30, 2012; the disclosures of each of which are hereby incorporated entirely herein by reference. By non-limiting example, implementations of coated copper wire that could be used in various implementations disclosed herein may include wires coated with tin (Sn), silver (Ag), nickel (Ni), palladium (Pd), gold (Au), an organic (carbon containing) material, a ceramic material, or any combination thereof, including any of the coating types disclosed in U.S. Patent Application Publication No. 20150311173 to Carpenter et al, entitled "Structures and methods for reducing corrosion in wire bonds," filed Apr. 25, 2014, the disclosure of which is hereby incorporated entirely herein by reference.

Figure 3:
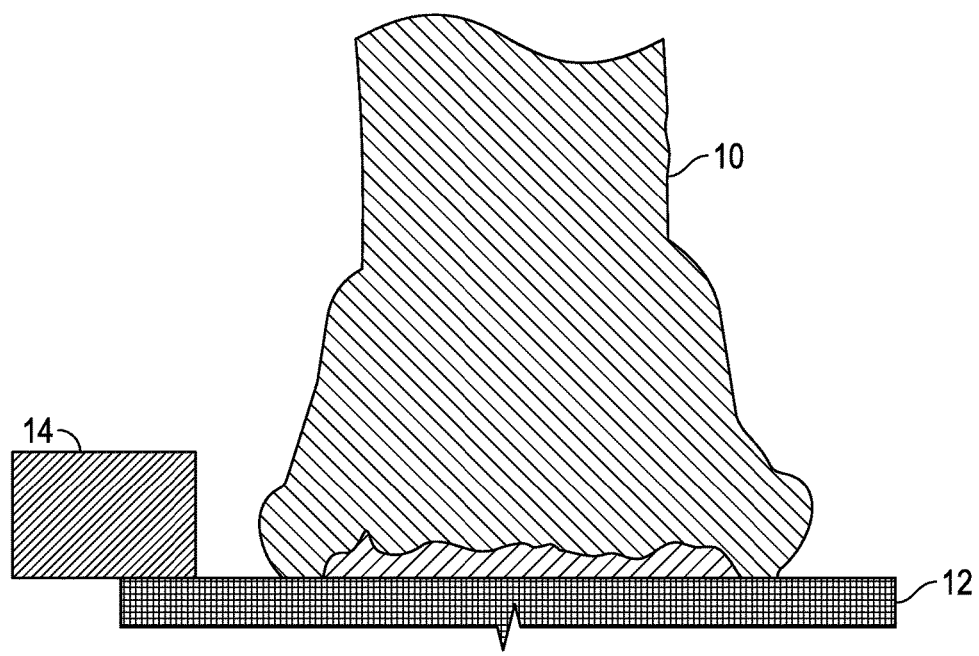
FIG. 3 is a cross sectional view of a wire bonded to a pad showing a sacrificial anode implementation coupled with the pad.

In a first implementation, a wire bond system includes a bond wire that includes Cu and a bond pad that includes Al. Referring to FIG. 3, an implementation of such a system with a wire 10 and pad 12 is illustrated. Also illustrated is a sacrificial anode 14, which is electrically coupled with the pad 12 by being placed directly onto the pad 12. In various implementations, however, the sacrificial anode 14 may not be placed in direct physical contact with the pad 12, but may be placed electrical contact with the pad 12 while still being in contact with the electrolyte(s) involved in a corrosion reaction. In this way, in various implementations, more than one pad may be electrically coupled with a single sacrificial anode.

The sacrificial anode 14 may be placed in electrical contact either prior to or after the wire bond has been formed, depending on the implementation.

The sacrificial anode may include one or more elements that have a standard electrode potential below a standard electrode potential of Al. By non-limiting example, the one or more elements may be magnesium (Mg) or an alloy of Mg and Al. In particular implementations, the one or more elements may be Be or an alloy of Be and Al. In other implementations Hf, uranium (U), Be, sodium (Na), calcium (Ca), potassium (K), lithium (Li) Mg, or any combination of thereof could be used. In various implementations, the sacrificial anode may include various combinations of materials and/or alloys, including composites having the desired standard electrode potentials. Because the sacrificial anode has a standard electrode potential below that of Al, Al becomes the cathode relative to the sacrificial anode, which significantly slows down the corrosion at the wire/pad interface.

Figure 4:
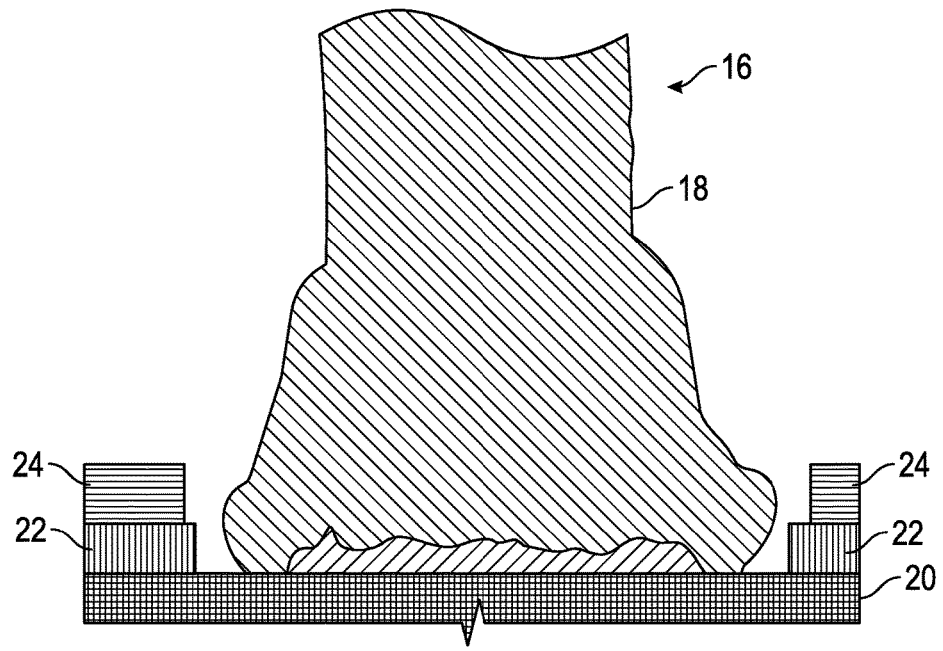
FIG. 4 is a cross sectional view of a wire bonded to a pad illustrating a sacrificial anode implementation coupled over the pad around the wire.

Referring to FIG. 4, a second implementation of a wire bond system 16 is illustrated. As illustrated, a wire 18 is coupled to a pad 20, the wire including Cu and the bond pad including Al. A sacrificial anode 22 is also included which is physically and electrically connected to the bond pad by being coupled over it. In this implementation, the sacrificial anode 22 is created through deposition/patterning/etching steps during processing of the semiconductor die itself, and is covered by the passivation layer(s) 24 of the semiconductor die. In various method implementations, the sacrificial anode 22 material may be deposited over the pad 20 via physical vapor deposition (PVD), chemical vapor deposition (CVD), metalorganic chemical vapor deposition (MOCVD), electroplating, electroless plating, and any other technique for forming a material over the pad material. When the pad 20 is opened, the passivation layer 22 is etched away and the sacrificial anode material may be either etched as a separate step or simultaneously during the passivation layer etch. Alternatively, in other method implementations, the sacrificial anode material may be patterned and etched to expose the pad 20 prior to the deposition and subsequent etching of the passivation material.

Similar to the first system implementation, the material of the sacrificial anode includes one or more elements that have a standard electrode potential below a standard electrode potential of Al, which may be any previously disclosed, including Mg, Be, Hf, U, Na, Ca, K, Li, and any combination thereof. In the first and second system implementations, any of the Cu-containing wire implementations previously disclosed in this document may also be used.

Referring to FIG. 2 for reference, the structure of a third system implementation can be illustrated. In such an implementation, the wire 26 contains Cu and the bond pad 28 is coupled to the bond wire. The pad 28 includes a material containing Al and one or more elements that have a standard electrode potential between a standard electrode potential of Cu and a standard electrode potential of Al. In various implementations, the material may be a metal alloy, a composite, or other material that includes Al. Because the elements and/or other materials included in the bond pad have a standard electrode potential between those of Cu and Al, the overall bond pad itself will have a higher electrode potential than Al alone. Because of this, the rate at which any theoretical corrosion reaction could take place is lowered, because the potential difference has been lowered. Lowering the theoretical reaction rate may have the effect of mitigating the corrosion reliability risk over the lifetime of the semiconductor package.

A wide variety of elements and combination of elements could be used in various system implementations. For example, the element used in addition to Al could be tungsten (W), zinc (Zn), chromium (Cr), Sn, silicon (Si), cadmium, (Cd), molybdenum (Mo), cobalt (Co), Cu, or any combination of these. In various implementations, other elements or compounds could also be used which have a standard electrode potential between the standard electrode potentials of Cu and Al. Also, various implementations of the third system may include any of the bond wire implementations, including wire alloys and coatings disclosed in this document. In these implementations, any combination of the bond wire implementations may be used in combination with the bond pad material implementations disclosed herein.

Figure 5:
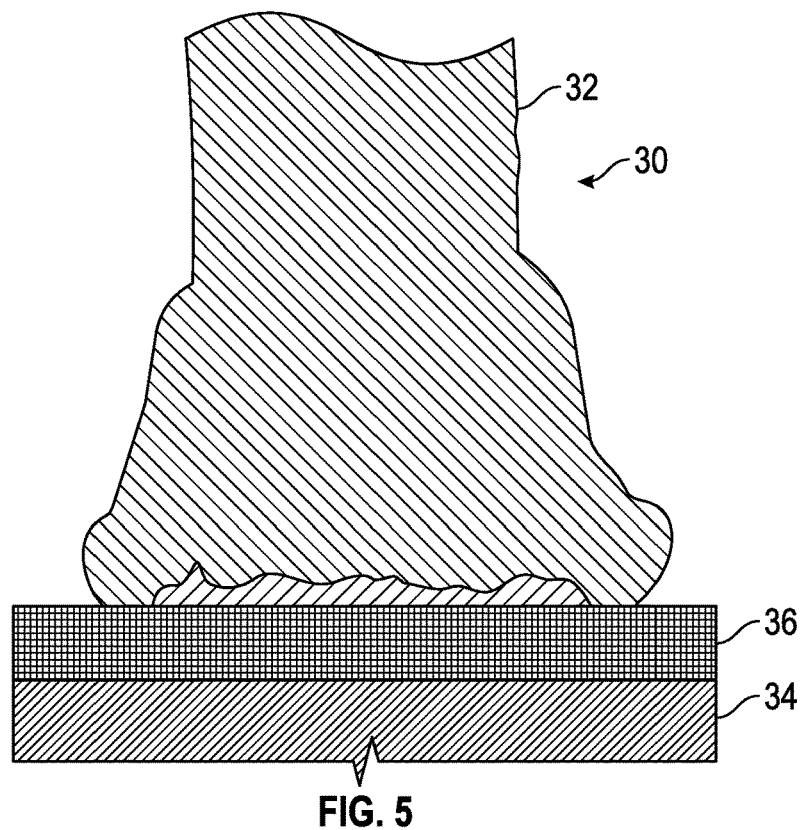
FIG. 5 is a cross sectional view of a wire bonded to a pad illustrating an implementation of a pad comprising an implementation of a layer formed between the wire and the pad.

Referring to FIG. 5, an implementation of a fourth system implementation 30 is illustrated. As illustrated, the system 30 includes a wire 32 and a bond pad 34. The wire 32 includes Cu and bond pad 34 includes Al, and they may be made of any wire or pad material disclosed in this document. A layer (coating) 36 is present that is coupled over the bond pad 34 and contains a material that includes one or more elements that have a standard electrode potential between a standard electrode potential of Al and a standard electrode potential of Cu. This layer 36 may be a single layer of homogenous material, whether an alloy or composite in various implementations. In others, it may be formed of various layers of different material types that have been deposited or formed one on the other. In some implementations, the layer 36 may extend entirely across the bond pad 34, but in others, the layer 36 may be located at the point where the wire 32 is to couple to the pad 34.

In various implementations, depending on the materials selected for the layer 36, its thickness, etc., the hardness mismatch that exists between Cu and Al can also be reduced, which can reduce the likelihood of pad damage occurring during wire bonding. Also, since materials like Zn and Cd are harder than Al, they may increase the contact area with the Al-containing pad and reduce the splash of the bond, similar to the benefits seen with Au wire bonding. The thickness of the layer may be about 30 angstroms to about 200 angstroms thick in various implementations. In various implementations, electroless deposition processes such as zincation may be used to avoid having to use patterning and etching processes.

Figure 6:
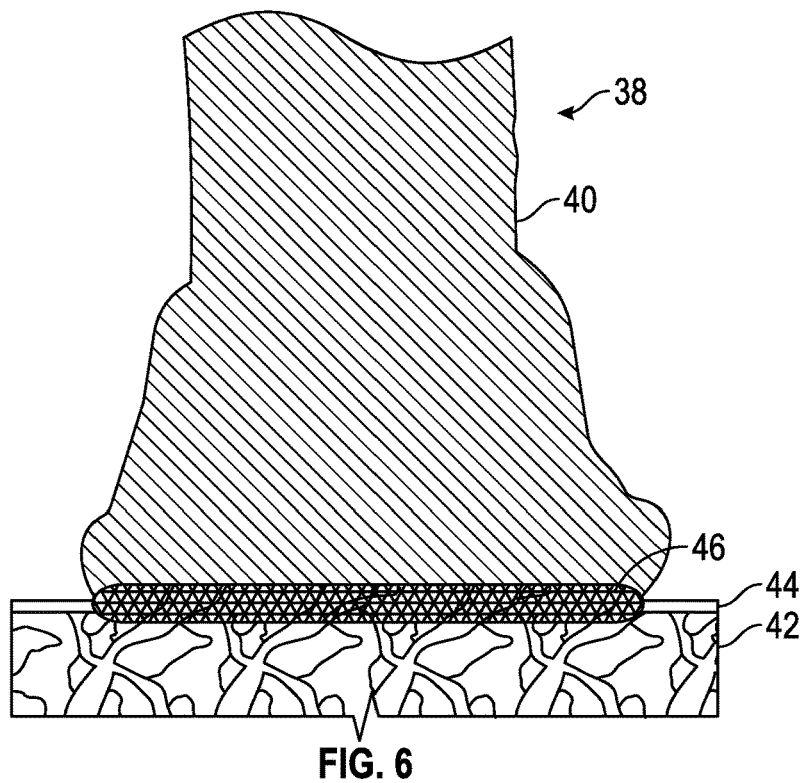
FIG. 6 is a cross sectional view of a wire bonded to a pad illustrating another implementation of a layer formed between the wire and the pad.

Referring to FIG. 6, another implementation 38 of a fourth system implementation is illustrated. In this implementation, a layer 44 is coupled over the pad 42 between the wire 40 and the pad 42. However, during the bonding process (and subsequent use), the material of the layer 44 may intermix/diffuse/react with the material of the pad 42 and/or the material of the wire 40, forming an IMC layer 46, if the materials are metals, or another solid mixture, solution, and/or alloy. The IMC layer 46 may comprise one or more elements with a standard electrode potential between those of Cu and Al, or the resulting compounds formed in the IMC layer may have a standard electrode potential between Cu and Al. In this way, a barrier to forming Cu-rich IMC compounds may be formed that may likely reduce the rate of the corrosion reaction, or a mixture/solid solution formed that enhances adhesion between the wire 40 and the pad 42, preventing cracking and voiding if corrosion were to take place.

Any of the elements and combinations of elements disclosed for use with the bond pad of the third system implementation may be used in the layer implementations 36, 44, including, by non-limiting example, W, Zn, Cr, Sn, Mo, Cd, Co, Cu, Al or any combination of these. In particular implementations, the layer may be a layer of Zn. Also, other materials and compounds with the desired standard electrode potential values could be used in various implementations. Furthermore, the bond pad 34 itself may include Al and any of the one or more elements having a standard electrode potential between the standard electrode potential of Cu and the standard electrode potential of Al disclosed in this document. This combination may further, in various implementations, be able to create materials with different standard electrode potentials capable of reducing the rates of corrosion reactions.

In some system implementations, the pad may include Al exclusively or AlSi and the wire may be an alloy like any of those disclosed in this document. In various implementations, the wire may include a CuNi alloy.

EXAMPLE 1

A set of 43 bipolar junction transistors each including a base pad and an emitter pad were used as part of an experiment to measure the wire bonding characteristics of various combinations of a Cu wire and pad material combinations. A pad that was an alloy of AlSi was used as the control and the following pad material types were used: AlCuW alloy, AlCu, and AlCuSi. The AlCu and AlCuSi alloys were deposited using a physical vapor deposition tool marketed under the tradename ENDURA by Applied Materials of Santa Clara, Calif. The AlCuW layer was deposited using a physical vapor deposition process using an AlCuW target. All of the various parts were wirebonded and evaluated post wirebonding. Analysis of all of the pads for the various materials including the control showed that all the parts met the specification of >75% for the percentage of the bonded area on the pad.

Table 1 summarizes the result of pad metal displacement-remaining (PMDr), all of the pads met the specification value of deformation between 20% to 80%.

TABLE 1

| Pad | AlCuW | AlCu | AlCuSi | AlSi |
|---|---|---|---|---|
| Base | 68% | 59% | 65% | 57% |
| Emitter | 70% | 67% | 61% | 54% |

On the average, AlCuW had the best PMDr for both the base and the emitter pads. AlCuSi has better PMDr than AlSi, and AlCu is better than AlCuSi for the Emitter pad. Generally, the trend in progressively higher values of PMDr of AlCuW>AlCu>AlCuSi (except for base pad)>AlSi was observed.

HAST testing of the parts indicated that, in contrast with the parts with AlSi pads, the AlCuW, AlCu, and AlCuSi pads all passed the test.

Given that the AlCuW alloy pad contains an element that has an effective standard electrode potential between Cu and Al, the rate of the corrosion reaction may be reduced. In addition, W is believed to restrict segregation of Cu in the pad and react with the Al material which may further serve to prevent formation of Cu-rich IMC compounds that are vulnerable to corrosion, as discussed in the '455 provisional and in the paper by Qin et al.

In places where the description above refers to particular implementations of wire, pad, and wire bonding systems and implementing components, sub-components, methods and sub-methods, it should be readily apparent that a number of modifications may be made without departing from the spirit thereof and that these implementations, implementing components, sub-components, methods and sub-methods may be applied to other wire, pad, and wire bonding systems.

What is claimed is:

1. A wire bond system comprising:
   a bond wire comprising Cu;
   a bond pad comprising an aluminum alloy; and
   a sacrificial anode electrically coupled with the bond pad;
   wherein the sacrificial anode does not physically contact the bond pad.

2. The system of claim 1, wherein the sacrificial anode comprises one of Mg, Hf, Be, or any combination thereof.

3. A wire bond system comprising:
   a bond wire comprising Cu;
   a bond pad comprising an aluminum alloy;
   a sacrificial anode physically and electrically coupled over at least a portion of the bond pad; and
   one of an alloy stack or an intermetallic layer formed through bonding the bond wire through the sacrificial anode with the bond pad.

4. The system of claim 3, wherein the sacrificial anode comprises one of Mg, Hf, Be, or any combination thereof.

5. A wire bond system comprising:
   a bond wire comprising Cu;
   a bond pad coupled to the bond wire, the bond pad comprising an aluminum alloy;
   a layer forming a sacrificial anode coupled to the bond pad between the bond wire and the bond pad; and
   one of an alloy stack or an intermetallic layer formed through bonding the bond wire through the layer with the bond pad.

6. The system of claim 5, wherein the layer comprises W.

7. The system of claim 5, wherein the layer comprises Zn.

8. The system of claim 5, wherein the layer comprises Cr.

9. The system of claim 5, wherein the layer comprises Sn.

10. The system of claim 5, wherein the layer comprises one or more elements selected from the group consisting of Mo, Cd, Co, Ni, Fe, Cu, and any combination thereof.

* * * * *